United States Patent
Zagar et al.

[11] Patent Number: 5,726,931
[45] Date of Patent: Mar. 10, 1998

[54] DRAM WITH OPEN DIGIT LINES AND ARRAY EDGE REFERENCE SENSING

[75] Inventors: Paul S. Zagar; Mirmajid Seyyedy, both of Boise, Id.

[73] Assignee: Micron Technology, Inc., Boise, Id.

[21] Appl. No.: 804,182

[22] Filed: Feb. 20, 1997

Related U.S. Application Data

[63] Continuation of Ser. No. 577,767, Dec. 22, 1995, Pat. No. 5,608,668.

[51] Int. Cl.$^6$ .............. G11C 11/24; G11C 7/00; G11C 7/02
[52] U.S. Cl. .............. 365/149; 365/189.09; 365/207; 365/210
[58] Field of Search .............. 365/149, 189.09, 365/200, 207, 208, 210, 226

[56] References Cited

U.S. PATENT DOCUMENTS

| | | | |
|---|---|---|---|
| 4,425,633 | 1/1984 | Swain | 365/194 |
| 4,903,344 | 2/1990 | Inoue | 365/51 |
| 5,235,550 | 8/1993 | Zagar | 365/189.09 |
| 5,311,478 | 5/1994 | Zagar et al. | 365/230.06 |
| 5,325,331 | 6/1994 | Parkinson et al. | 365/189.06 |
| 5,369,622 | 11/1994 | McLaury | 365/233 |
| 5,369,668 | 11/1994 | Casper et al. | 365/189.09 |
| 5,465,232 | 11/1995 | Ong et al. | 365/189.05 |
| 5,506,811 | 4/1996 | McLaury | 365/233 |
| 5,608,668 | 3/1997 | Zagar et al. | 365/149 |

FOREIGN PATENT DOCUMENTS

| | | |
|---|---|---|
| 0223621 | 5/1987 | European Pat. Off. |
| 6103755 | 4/1994 | Japan |

OTHER PUBLICATIONS

PCT Search Report for International No. PCT/US 96/20299, dated Apr. 10, 1997, completed by Authorized office Lucia Van Pinxteren, 7 pages.

Primary Examiner—David C. Nelms
Assistant Examiner—Trong Quang Phan
Attorney, Agent, or Firm—Schwegman, Lundberg, Woessner & Kluth, P.A.

[57] ABSTRACT

A memory circuit is described which increases the density of memory cells by including a reference circuit. The memory circuit has an open digit line architecture where sense amplifiers use two digit lines to sense data stored in the memory cells. One of the digit lines is used as a reference while the other digit line is active. A reference circuit is described which can be used to replace one of the digit lines connected to the sense amplifier circuit. The reference circuit models the electrical characteristics of a digit line by including a capacitor and a transistor, each sized to match the characteristics of a digit line.

15 Claims, 10 Drawing Sheets

DRAM WITH OPEN DIGIT LINES AND ARRAY EDGE REFERENCE SENSING

This application is a continuation of U.S. patent application Ser. No. 08/577,767, filed Dec. 22, 1995, to be issued as U.S. Pat. No. 5,608,668 on Mar. 4, 1997.

TECHNICAL FIELD OF THE INVENTION

The present invention relates generally to integrated memory devices and in particular the present invention relates to memory devices having an open digit line architecture.

BACKGROUND OF THE INVENTION

Integrated circuit memories have become increasingly dense as the need for more memory storage increases. While fabrication techniques and design options have been fairly successful in maintaining steady increases in memory storage from design generation to generation, the need for new highly populated circuits continues.

A dynamic random access memory (DRAM) device is typically comprised of an arrangement of individual memory cells. Each memory cell comprises a capacitor capable of holding a charge and an access transistor for accessing the capacitor charge. The charge is referred to as a data bit and can be either a high voltage or a low voltage. Data can be either stored in the memory cells during a write mode, or data may be retrieved from the memory cells during a read mode. The data is transmitted internally on signal lines, referred to as bit or digit lines, which are coupled to input/output lines through transistors used as switching devices.

Sensing circuitry is included in the memories to both sense data stored in the memory cells and amplify the data for outputting. The sensing circuitry typically compares a charge stored on a memory cell with a known reference. The physical space required to implement both the communication lines and the reference circuits limit the density possible on a given integrated circuit.

For the reasons stated above, and for other reasons stated below which will become apparent to those skilled in the art upon reading and understanding the present specification, there is a need in the art for a dynamic memory circuit which maximized the available space of a memory array, including the edges of the array.

SUMMARY OF THE INVENTION

The above mentioned problems with integrated memories and other problems are addressed by the present invention and which will be understood by reading and studying the following specification. A dynamic memory is described which uses reference circuitry to sense data stored on memory cells located at the edges of a memory array.

In particular, the present invention describes a memory having an open digit line architecture wherein a reference circuit is provided to allow additional memory cells and digit lines to be located in a memory array of the memory device. The reference circuit is coupled to a sense amplifier circuit to replace a digit line by modeling the electrical characteristics of the digit line. In one embodiment, the reference circuit includes a capacitor sized to model the parasitic capacitance of a digit line, and a transistor sized to model transistors normally coupled to a digit line. In another embodiment, redundant digit lines and memory cells are included in the reference circuit. The open digit line memory can be designed with a hierarchical digit line structure.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
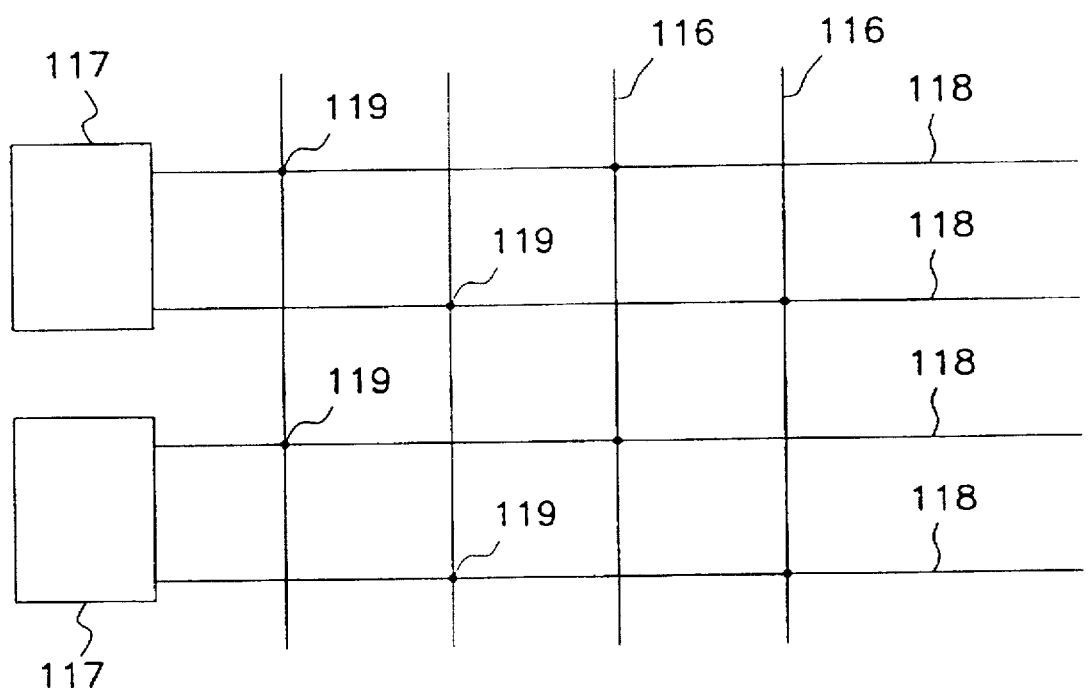
FIG. 1 is an illustration of a prior art memory device having a folded digit line architecture.
Figure 2:
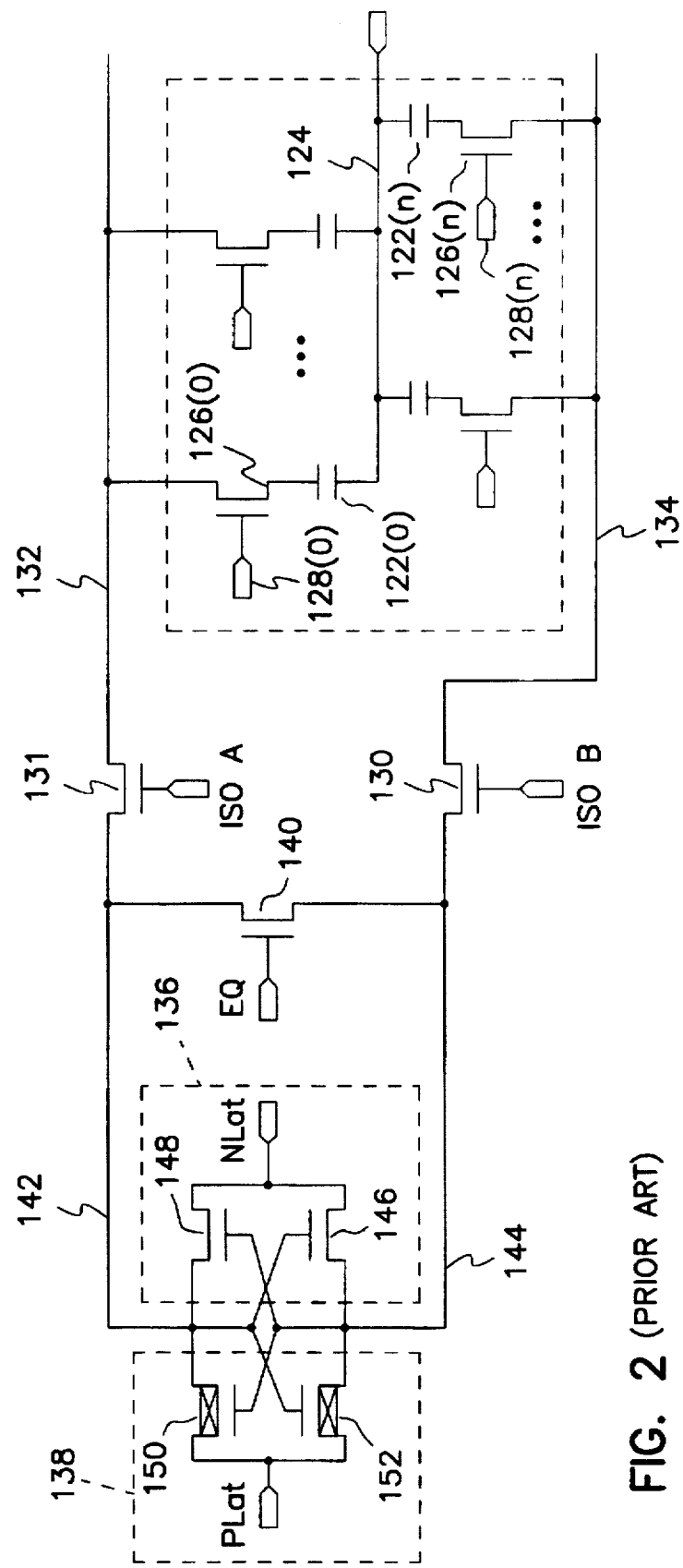
FIG. 2 is a schematic of a portion of the memory of FIG. 1.

FIG. 1 illustrates a prior art memory array using dual, or folded, digit lines to communicate data stored in the memory cells to sense amplifiers. The memory array is arranged in rows 116 and columns 118, with a memory cell 119 located at every-other row and column intersection. Sense amplifier circuitry 117 is provided for each pair of columns. This configuration, as known to those skilled in the art, is a folded digit line architecture. FIG. 2 illustrates two columns of the array of FIG. 1. The memory has a plurality of memory cells 122(0)–(n) which are fabricated as capacitors having one capacitive plate formed as a common cell plate 124 and the other node connected to an access transistor 126(0)–(n). Each access transistor is a n-type transistor having its gate connected to a word line 128(0)–(n). The cell plate 124 is typically biased to one-half the power supply voltage (Vcc) by a biasing source (not shown).

Digit lines 132 and 134 are each connected to some of the access transistors and memory cells. When access transistors 126 are selectively activated, the charge stored on the corresponding memory cell 122 is coupled to one of the digit lines. N-type isolation transistors 130 and 131 are used to isolate digit lines 134 and 132, respectively, from both the n-sense amplifier 136 and the p-sense amplifier 138. Equilibrate transistor 140 is used to equalize the nodes of the sense amps to the same voltage, as described below.

Figure 3:
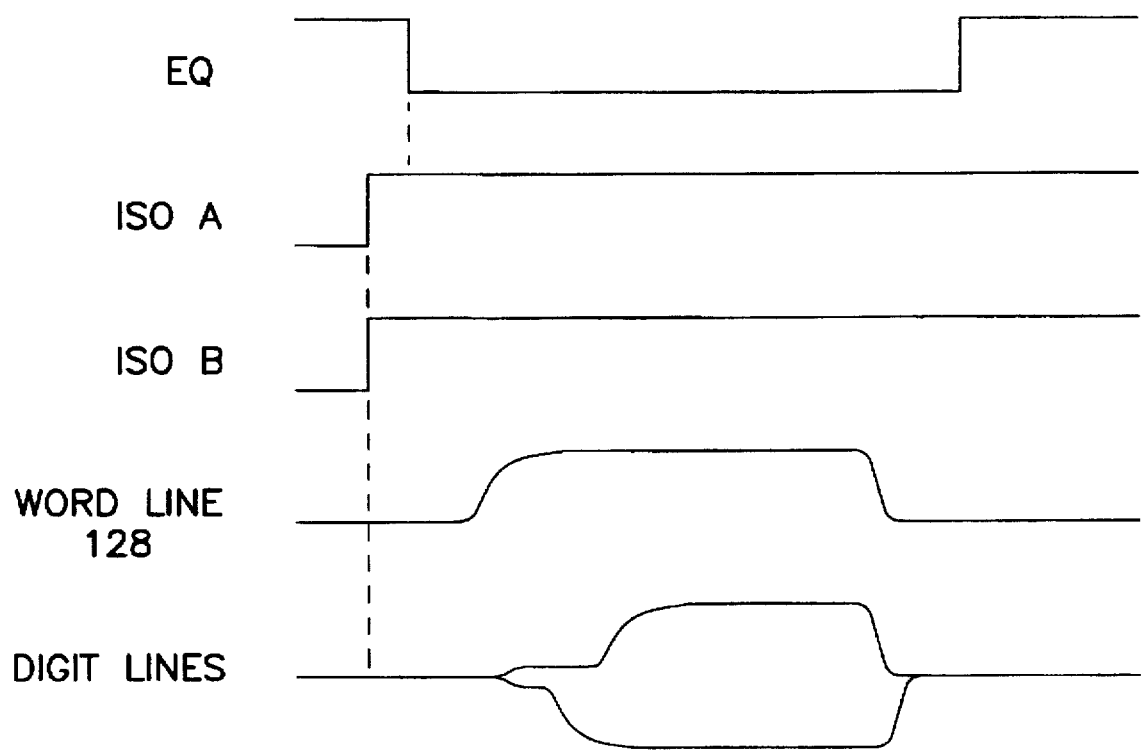
FIG. 3 is a timing diagram of the memory of FIG. 1.

In operation, data stored in the memory cells can be accessed and sensed following the process shown in FIG. 3. The first step is to equilibrate nodes 142 and 144 of sense amps 136 and 138 to Vcc/2, as sourced by a biasing circuit (not shown), by holding the gate of transistor 140 (EQ) high. The differential voltage across the sense amps is therefore zero with each node having a preferred voltage of one-half the supply voltage (Vcc). The next step is to activate isolation transistors 131 and 130 by providing their gates (ISO A and ISO B, respectively) with a high voltage. This connects the digit lines 132 and 134 to the sense amps 136 and 138 and allows the digit lines to also stabilize to Vcc/2. One of the memory cell access transistors 126(0)–(n) is then selectively activated by raising the associated word line 128(0)–(n) gate voltage. The charge, or lack of charge, stored on the selected memory cell 122 is then shared with one of the digit lines. If a logical "one" is stored on the capacitor the associated digit line will be slightly raised, for example by a voltage of approximately 100 mv. It will be understood that the charge shared with the digit line is directly dependant upon the charge stored on the memory cell. If the memory cell is un-charged the digit line voltage will drop, for example by 100 mv.

The n-sense amplifier 136 and the p-sense amplifier 138, as known to one skilled in the art, sense a differential between the digit lines and drive the digit lines to full rails in response. N-sense amplifier 136 has two n-channel transistors having their gates cross-coupled to the source of the other transistor. The drains of each transistor are connected together and controlled by an NLat line. The NLat line is typically pre-charged to the same level that nodes 142 and 144 have been equalized to, Vcc/2. The voltage on the NLat line is lowered to sense a high voltage on one of the nodes. Assuming for example that node 142 is 100 mv above node 144, transistor 146 will begin to turn on when the NLat drops by a threshold voltage below node 142. Node 144 will then be pulled to NLat to insure that transistor 148 does not turn on. Similarly, p-sense amplifier 138 has two cross-coupled p-channel transistors 150 and 152. The drains of each transistor are connected together and controlled by a PLat line. The PLat line is typically pre-charged to the same level that nodes 142 and 144 have been equalized to, Vcc/2. The voltage on the PLat line is raised to sense a low voltage on one of the nodes. Assuming for example that node 144 is 100 mv below node 142, transistor 150 will begin to turn on when the PLat increases by a threshold voltage above node 144. Node 142 will then be pulled to PLat to insure that transistor 152 does not turn on. The NLat and PLat are strobed to full power rails, ground and Vcc, respectively. If one of the digit lines is higher, therefore, that digit line will be driven to Vcc while the complementary digit line is pulled to ground.

It will be appreciated that the digit lines 132 and 134 are substantially balanced. That is, the parasitic capacitance of each digit line is equal and the number of access transistors coupled to each is equal. This allows each digit line connected to the sense amplifiers to be used as a reference when reading a memory cell coupled to the other digit line. As explained above, the folded digit line architecture is not the most efficient way of locating memory cells in the memory array.

MEMORY DEVICE HAVING OPEN DIGIT LINES

Figure 4:
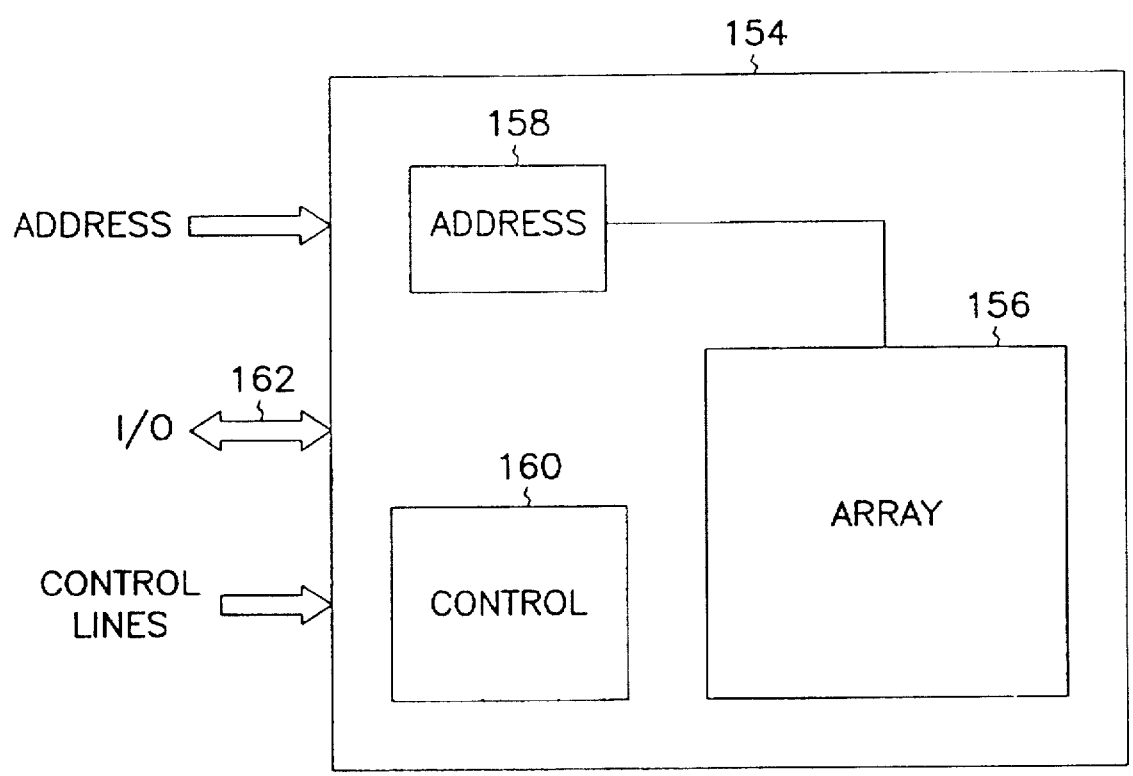
FIG. 4 is a block diagram of an memory device incorporating the present invention.
Figure 5:
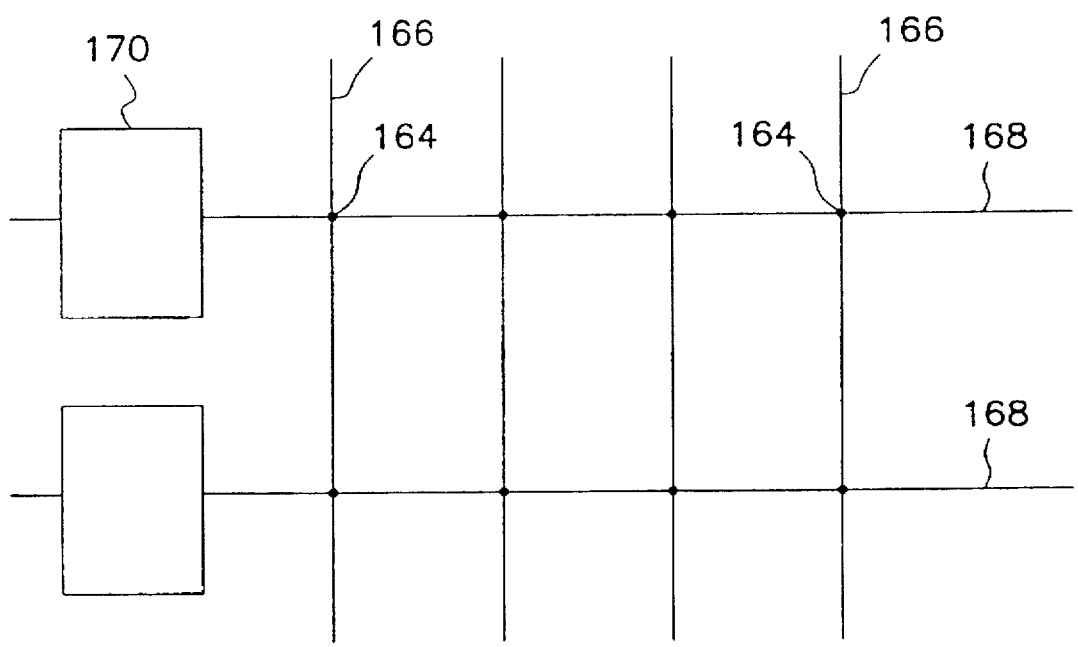
FIG. 5 is an open digit line layout of the array of the memory of FIG. 4.

FIG. 4 illustrates a dynamic memory 154 having an open digit line architecture of the present invention. The memory includes an array of memory cells 156, address circuitry for addressing the memory cells 158, control circuitry 160, input and output connections 162 for communicating data with an external microcontroller. The memory array 156 of FIG. 4 is arranged in an open digit line architecture. That is, a memory cell 164 is located at each row 166 and column 168 intersection, as seen in FIG. 5. Sense amplifier circuitry 170 is provided for each column.

Figure 6:
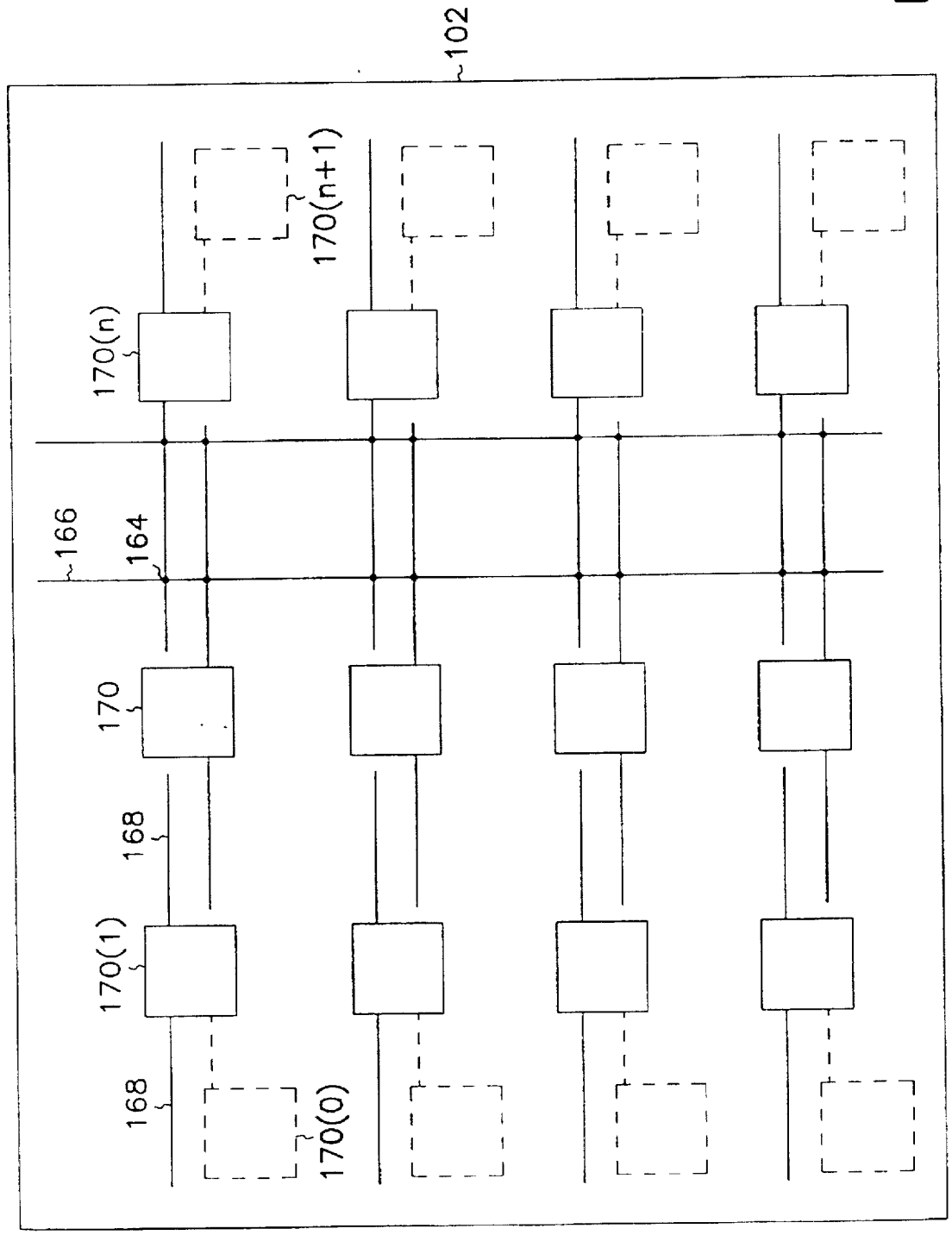
FIG. 6 is a more detailed layout of the array of the memory of FIG. 4.

The digit lines 168, therefore, can not be arranged in adjacent pairs as described above in the folded digit line memory. FIG. 6 illustrates a portion of the array 156 of memory 154. The columns of the array are arranged as open digit lines where sense amplifier circuitry 170 has two digit lines 168 located on opposite sides. The sense amplifier circuitry 170 allows a memory cell 164 to be located at each intersection of a digit line and a row line 166. It will be appreciated that this architecture maximized the available space for memory cells. There is, however, unused space around sense amplifiers 170(1) and 170(n), located on the edges of the memory array. To maximize all of the array space, additional sense amplifiers 170(0) and 170(n+1) could be added. The second digit line needed for these sense amplifiers, however, would be missing. As explained below, the present invention allows for the addition of these sense amplifiers and the maximization of the array space.

Figure 7:
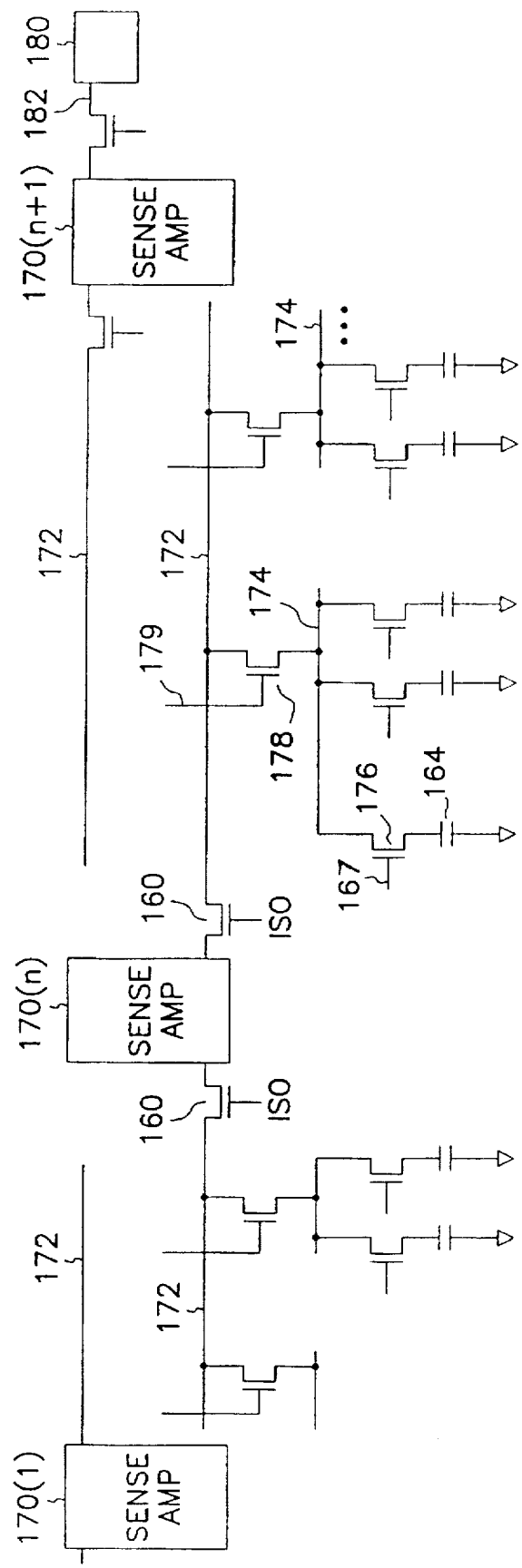
FIG. 7 is a schematic of a one embodiment of the digit line architecture of the memory of FIG. 4.

One embodiment the open digit line architecture shown in FIG. 6 uses a hierarchical design having global digit lines 172 and local digit lines 174, as illustrated in FIG. 7. The global digit lines are interleaved, such that an activated row or word line 167 will access a memory cell on each global digit line. Each global digit line has a large number of memory cells which can be coupled thereto. For example, each global digit line can have one of 256 memory cells selectively coupled through an access transistor 176. The local digit lines 174 are selectively coupled to a global digit line through pass transistors 178. The pass transistors have a gate 179 connected to a select line for selectively activating one of the pass transistors.

Similar to the folded digit line architecture, the sense amplifier circuits 170 compare the voltage of two global digit lines to read a memory cell. The sense amplifiers, however, use digit lines located on opposite sides of the sense amplifier. By equilibrating the two global digit lines to a pre-determined voltage, one of the global digit lines can be used as a reference. That is, the global digit lines are equilibrated and a memory cell 164 is accessed by raising one of the word lines 167. The charge stored on the memory cell is shared with one of the local digit lines 174. By selectively activating transistor 178, the charge is shared with one of the global digit lines 172. The sense amplifier circuits compare the voltage on one of the global digit lines with the prior equilibrated global digit line. The sense amplifiers then amplify the voltage differential to reflect the data stored on the memory cell.

As explained above, sense amplifiers 170(0) and 170(n+1), located on the edges of memory array 156, do not have a second global digit line which can be used as a reference. Reference circuitry 180, therefore, is provided to allow for efficient use of the array edges. Different reference circuits can be used to simulate the missing digit line. A digit line, either global or local, can be represented by a capacitor circuit and a transistor circuit. The capacitor is a combination of several different parasitic capacitances, including capacitances due to the integrated circuit substrate, the memory cells, and the memory cell access transistors.

Figure 8:
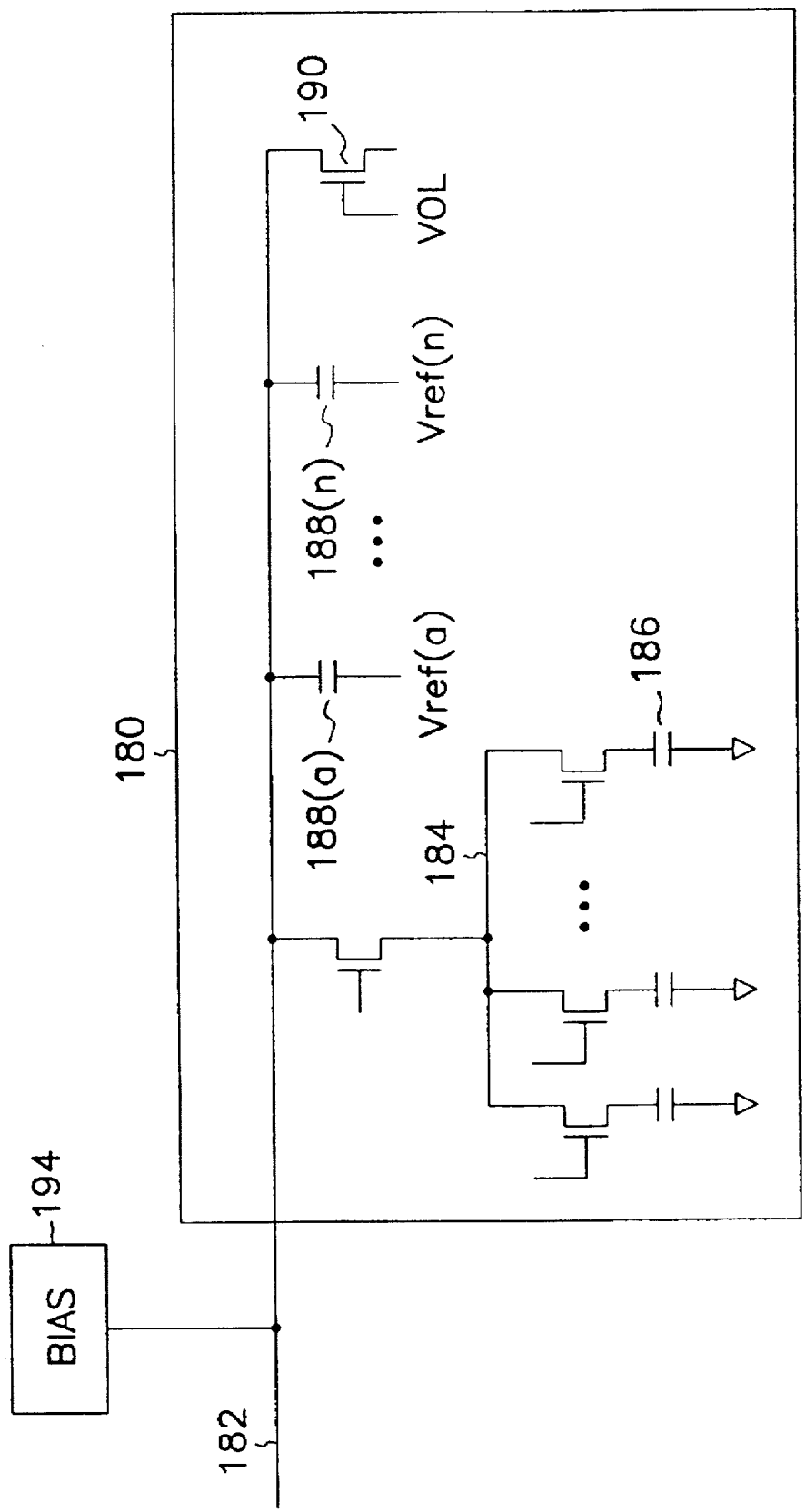
FIG. 8 is a schematic of one embodiment of a reference circuit of the present invention.
Figure 9:
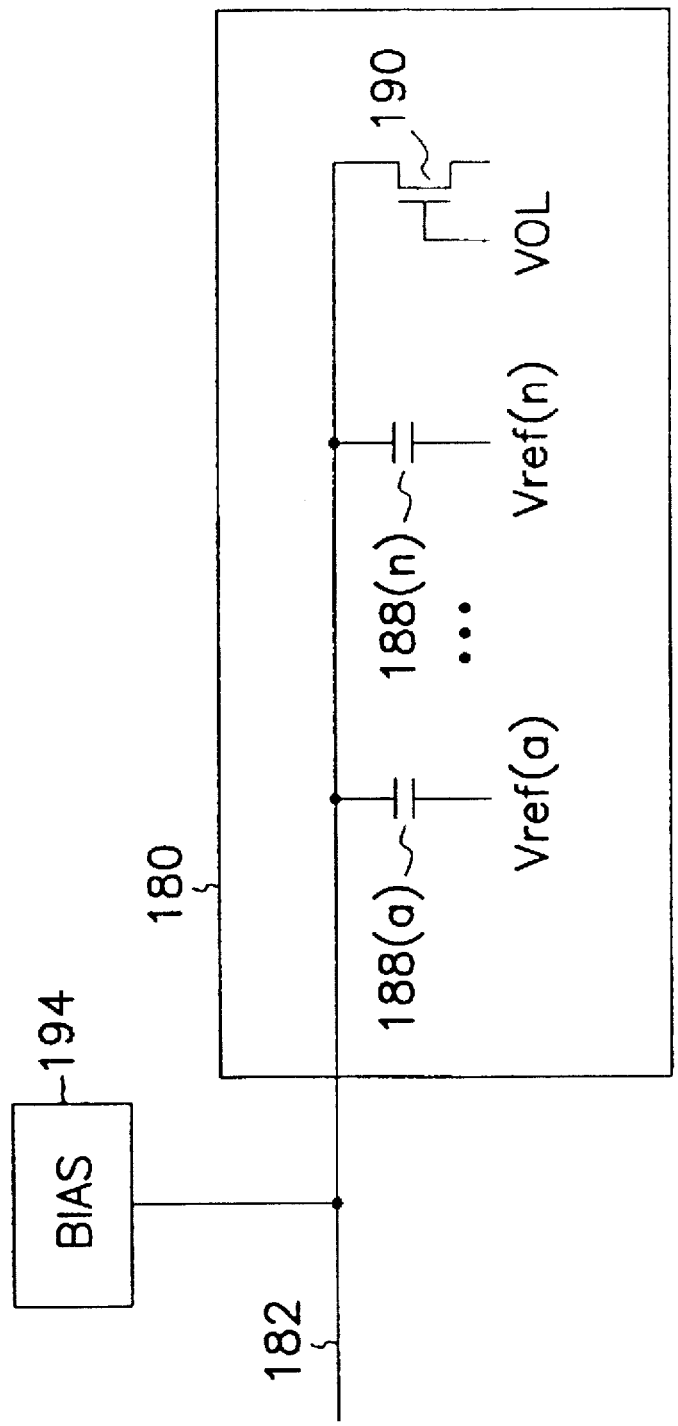
FIG. 9 is a schematic of another embodiment of a reference circuit of the present invention.

FIGS. 8 and 9 illustrate two embodiments of a reference circuit 180 of the present invention. The circuit illustrated in FIG. 8 is a truncated global digit line 182 having one local digit line 184 which can be used for redundancy. That is, the local digit line and the redundant memory cells 186 coupled thereto can be used to replace a local digit line 174 or memory cell 164 which is defective. The truncated digit line 182 also includes compensating capacitors 188(*a*)–188(*n*) which are sized to model the parasitic capacitances of a global digit line, and an optional transistor circuit 190 which is sized to model the missing local digit line pass transistors 178. The actual number of compensating capacitors needed in the reference circuit will be dependent upon the characteristics of the digit line. For example, in one memory circuit design parasitic capacitances can be experienced between the digit line and ground, the digit line and the integrated circuit substrate, and the digit line and memory cell plate. Alternative memory circuit designs may create different parasitic capacitances. Each compensating capacitor included in the reference circuit 188 has one plate connected to a reference voltage Vref(a)–Vref(n) which can be any potential. For example, Vref(a)–(n) can be ground, substrate bias, a cell plate reference voltage, or any other voltage.

Optional transistor circuit 190 is preferably an n-channel transistor, but can be any type of transistor needed to model the electrical characteristics of the digit line. The transistor has a drain connected to the digit line 182 and a gate connected to the off or inactive word line voltage (VOL). That is, the word lines 167 have a voltage which activates the access transistors 176, and a state which deactivates the access transistors. This off- line voltage is preferably ground, but can be any voltage such as Vcc when the access transistor is a p-channel device. The source of the transistor circuit 190 can be connected to a reference voltage, left floating or not even fabricated. The source, therefore, is optional.

An alternate reference circuit 180 is illustrated in FIG. 9. This alternate circuit includes the compensating capacitors 188(*a*)–(*n*) sized to model the parasitic capacitances of a global digit line, and the optional transistor circuit 190 sized to model the missing local digit line pass transistors 178, as explained above. The alternate embodiment, therefore, does not include redundant memory cells.

The reference circuit 180 can be used to sense data stored in a memory cell using one of two techniques: time sensing, and level sensing. The time sensing technique involves equilibrating the global digit line 172 coupled to sense amplifier 170(n+1) and the truncated digit line 182. The truncated digit line is then isolated from the sense amplifier and a memory cell is coupled to the global digit line 172. The global digit line is then isolated from the sense amplifier and the sense amplifier circuit is activated. The truncated digit line and the global digit line can then be connected to sense amplifier 170(n+1). The level sensing technique involves equilibrating the global digit line 172 and the truncated digit line 182 to a predetermined voltage as sourced by an optional voltage biasing circuit 194. After the digit lines have been equilibrated and the bias circuit turned off, a memory cell is coupled to the global digit line 172 and sense amplifier 170(n+1) is activated.

Figure 10:
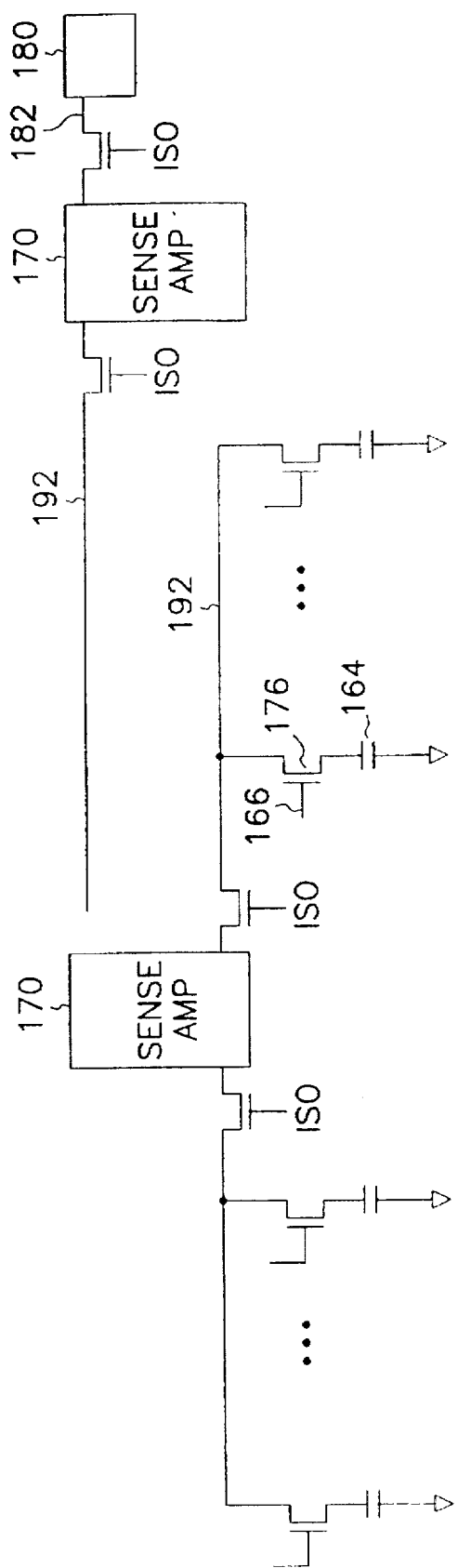
FIG. 10 is a schematic of another embodiment of the digit line architecture of the memory of FIG. 4.

In a memory which does not have global digit lines, the alternate reference circuit of FIG. 9 could be used, or the redundant digit line could be modified to reflect the memory architecture. FIG. 10 illustrates a portion of the open digit line memory 154 wherein the array 156 uses digit lines 192. Memory cells 164 are selectively coupled to the digit lines 192 using access transistors 176. The reference circuit 180 includes a capacitor sized to model the parasitic capacitance of a digit line 192, and a transistor circuit sized to model the missing memory cell access transistors 176. As with the hierarchical memory structure, either time sensing or level sensing techniques can be used. It will be appreciated that any open digit line memory can incorporate the present invention.

CONCLUSION

Reference circuitry has been described which can be included in a memory device to maximize the use of available array area. The reference circuitry is coupled to sense amplifiers located along the edge of the array and models the operating characteristics of the highest level digit line of the memory. Memories using digit lines and global digit lines have been described where the reference circuitry includes a capacitance model and a transistor model.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, redundant memory cells can be included in the reference circuit of FIG. 10. Therefore, it is manifestly intended that this invention be limited only by the claims and the equivalents thereof.

What is claimed is:

1. An integrated memory device comprising:

an array of memory cells;

addressing circuitry for receiving an address of the memory cells; and control circuitry for controlling read and write operations of the memory device;

the array of memory cells comprising:

memory cell capacitors having a first plate and a second plate, the first plate being coupled to a reference voltage and the second plate being coupled to a digit line through an n-channel access transistor, the access transistor being controlled by a word line voltage, and a sense amplifier having a first input selectively coupled to the digit line and having a second input selectively coupled to a reference circuit for modeling electrical characteristics of the digit line, the reference circuit comprising:

a plurality of compensating capacitors having a first plate coupled to the sense amplifier and a second plate coupled to a capacitor reference voltage, and an n-channel transistor having a gate coupled to receive an inactive word line voltage.

2. The integrated memory device of claim 1 wherein the capacitor reference voltage is ground potential.

3. The integrated memory device of claim 1 wherein the capacitor reference voltage is a substrate bias voltage.

4. An integrated memory circuit having an open digit line architecture comprising:

a memory array comprising memory cells arranged in rows and columns;

a plurality of sense amplifier circuits located within the memory array and coupled to oppositely extending first and second active digit lines; and a plurality of peripheral sense amplifier circuits located within the memory array and along an edge of the memory array, the peripheral sense amplifier circuits having first node coupled to a third active digit line, and a second node coupled to a reference circuit for modeling electrical characteristics of the third active digit line.

5. The integrated memory circuit of claim 4 wherein the reference circuit comprises:

a reference line coupled to the second node of the plurality of peripheral sense amplifier circuits; and a capacitor having a first plate connected to the reference line and a second plate connected to receive a reference voltage.

6. The integrated memory circuit of claim 5 wherein the reference circuit further comprises:

a transistor connected to the reference line, the transistor having a drain connected to the reference line and a gate connected to the inactive voltage level.

7. The integrated memory circuit of claim 6 wherein the transistor is sized to model access transistors coupled to the digit line.

8. The integrated memory circuit of claim 5 wherein the capacitor is sized to model parasitic capacitance of the digit line.

9. The integrated memory circuit of claim 5 further comprising a voltage bias circuit coupled to the reference line.

10. A method of providing a reference voltage to a differential sense amplifier in a memory device, the sense amplifier having a first node and a second node coupled to an active digit line, the method comprising the steps of:

charging a reference circuit to the reference voltage, the reference circuit comprising a capacitor for modeling electrical characteristics of the digit line; and coupling the reference circuit to the first node of the sense amplifier.

11. The method of claim 10 wherein the capacitor comprises a plurality of capacitors.

12. The method of claim 10 wherein the reference circuit further comprises a transistor.

13. A method of fabricating a memory array in a memory device having an open digit line architecture, the method comprising the steps of:

fabricating first and second active digit lines coupled to sense amplifiers located within the memory array, the first and second digit lines extending in opposite directions from the sense amplifiers; and fabricating a third active digit line and a reference circuit comprising a capacitor for modeling electrical characteristics of the third active digit line to extend in opposite directions from sense amplifiers located in the memory array and along an edge of the memory array, the reference circuit located adjacent to the edge of the memory array.

14. The method of claim 13 wherein the capacitor comprises a plurality of capacitors.

15. The method of claim 13 wherein the reference circuit further comprises a transistor.

* * * * *